US010666159B2

(12) United States Patent
Liu et al.

(10) Patent No.: US 10,666,159 B2
(45) Date of Patent: May 26, 2020

(54) SINGLE-PHASE CONVERTER CONTROL METHOD AND APPARATUS

(71) Applicant: Huawei Technologies Co., Ltd., Shenzhen (CN)

(72) Inventors: Fangcheng Liu, Shanghai (CN); Kai Xin, Shanghai (CN); Yunfeng Liu, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/232,741

(22) Filed: Dec. 26, 2018

(65) Prior Publication Data

US 2019/0199235 A1    Jun. 27, 2019

(30) Foreign Application Priority Data

Dec. 26, 2017  (CN) .......................... 2017 1 1438629

(51) Int. Cl.
*H02M 7/487* (2007.01)
*H02M 1/12* (2006.01)
(Continued)

(52) U.S. Cl.
CPC ............ *H02M 7/487* (2013.01); *H02J 3/383* (2013.01); *H02M 1/12* (2013.01); *H02M 7/5395* (2013.01);
(Continued)

(58) Field of Classification Search
CPC ............ H02M 7/487; H02M 7/53871; H02M 7/5395; H02M 1/12; H02M 2001/123; H02J 3/383; H03K 17/567
See application file for complete search history.

(56) References Cited

U.S. PATENT DOCUMENTS

| 2013/0155747 A1* | 6/2013 | Wang ................... H02M 7/487 363/132 |
| 2016/0372927 A1* | 12/2016 | Dent ..................... H02M 7/537 |
| 2019/0229646 A1* | 7/2019 | Liu ....................... H02M 7/487 |

FOREIGN PATENT DOCUMENTS

| CN | 102684533 A | 9/2012 |
| CN | 102723889 A | 10/2012 |

(Continued)

OTHER PUBLICATIONS

Machine Translation and Abstract of Chinese Publication No. CN102684533, Sep. 19, 2012, 15 pages.
(Continued)

*Primary Examiner* — Kyle J Moody
*Assistant Examiner* — Jye-June Lee
(74) *Attorney, Agent, or Firm* — Conley Rose, P.C.

(57) ABSTRACT

A single-phase converter control method and apparatus, includes calculating on a voltage corresponding to a first level output by a single-phase converter, a voltage corresponding to a second level output by the single-phase converter, and a voltage reference value about the voltage corresponding to the first level and the voltage corresponding to the second level to obtain a common-mode modulated-wave change rate of the single-phase converter, where the first level is a direct-current-side positive-bus level, and the second level is a direct-current-side negative-bus level, calculating on a first-phase initial modulated wave of the single-phase converter, a second-phase initial modulated wave of the single-phase converter, and the common-mode modulated-wave change rate to obtain a common-mode modulated wave of the single-phase converter, and calculating on the first-phase initial modulated wave, the second-phase initial modulated wave, and the common-mode modu-
(Continued)

lated wave to obtain a pulse width modulated wave of the single-phase converter.

18 Claims, 10 Drawing Sheets

(51) Int. Cl.
  *H03K 17/567* (2006.01)
  *H02M 7/5395* (2006.01)
  *H02J 3/38* (2006.01)
  *H02M 7/5387* (2007.01)

(52) U.S. Cl.
  CPC ...... *H02M 7/53871* (2013.01); *H03K 17/567* (2013.01); *H02M 2001/123* (2013.01)

(56) References Cited

FOREIGN PATENT DOCUMENTS

| CN | 103746585 A | | 4/2014 |
|---|---|---|---|
| CN | 203761293 U | * | 8/2014 |
| CN | 203761293 U | | 8/2014 |
| CN | 104022669 | | 9/2014 |
| CN | 107070278 | | 8/2017 |
| CN | 107508483 | | 12/2017 |
| EP | 2709261 A1 | | 3/2014 |

OTHER PUBLICATIONS

Machine Translation and Abstract of Chinese Publication No. CN104022669, Sep. 3, 2014, 20 pages.
Machine Translation and Abstract of Chinese Publication No. CN107070278, Aug. 18, 2017, 20 pages.
Machine Translation and Abstract of Chinese Publication No. CN107508483, Dec. 22, 2017, 22 pages.
Foreign Communication From a Counterpart Application, Chinese Application No. 201711438629.4, Chinese Office Action dated Jul. 1, 2019, 5 pages.
Machine Translation and Abstract of Chinese Publication No. CN103746585, Apr. 23, 2014, 15 pages.
Yang, X., et al., "Discontinuous PWM in Single-phase Grid-connected Inverter," IEEE 11th Conference on Industrial Electronics and Applications (ICIEA), Oct. 24, 2016, pp. 651-657.
Qu, H., et al, "Investigation on a Novel Discontinuous Pulse-Width Modulation Algorithm for Single-phase Voltage Source Rectifier," 17th International Conference on Electrical Machines and Systems (ICEMS), Oct. 22-25, 2014, pp. 1430-1436.
Machine Translation and Abstract of Chinese Publication No. CN203761293, Aug. 6, 2014, 22 pages.
Foreign Communication From a Counterpart Application, European Application No. 18214165.5, Extended European Search Report dated May 10, 2019, 8 pages.

* cited by examiner

SINGLE-PHASE CONVERTER CONTROL METHOD AND APPARATUS

CROSS-REFERENCE TO RELATED APPLICATIONS

This application claims priority to Chinese Patent Application No. 201711438629.4 filed on Dec. 26, 2017, which is hereby incorporated by reference in its entirety.

TECHNICAL FIELD

This application relates to the field of electronic technologies, and in particular, to a single-phase converter control method and apparatus.

BACKGROUND

A direct-current-side bus voltage is equally divided between direct-current-side series capacitors of a single-phase converter in an ideal case. However, in an embodiment, due to factors such as a capacitance error or inconsistent characteristics of switch devices, there is a deviation between voltages of the capacitors on a direct-current-side bus. As a result, system neutral-point potential fluctuates. That is, the system neutral-point potential is unbalanced. When the system neutral-point potential is unbalanced, quality of an output waveform is affected, and a voltage stress on a specific switching transistor is increased, and the switching transistor is damaged in a severe case. Based on this, a single-phase converter control method is provided and includes obtaining a voltage vector of a single-phase alternating current system, obtaining another voltage vector orthogonal to the voltage vector through a time delay link, converting the two voltage vectors into three-phase modulated waves, generating, based on an existing Discontinuous Pulse Width Modulation (DPWM) method of a three-phase alternating current system, a common-mode component that needs to be injected into the three-phase modulated waves, performing superposition on an initial modulated wave of the single-phase system and the injected common-mode component, to generate a modulated wave, and controlling activation and an on/off state of a switch device based on the modulated wave. However, the time delay link in the foregoing single-phase converter control method increases a system delay, reduces a system response speed, and affects a system control feature. In addition, a single-phase two-level converter lacks a system neutral-point potential balancing capability.

SUMMARY

Embodiments of the present application is to provide a single-phase converter control method and apparatus in order to improve a system neutral-point potential balancing capability, a system response speed, and system reliability.

According to a first aspect, an embodiment of this application provides a single-phase converter control method. A control system may perform calculation on a voltage corresponding to a first level output by a single-phase converter, a voltage corresponding to a second level output by the single-phase converter, and a voltage reference value about the voltage corresponding to the first level and the voltage corresponding to the second level to obtain a common-mode modulated-wave change rate of the single-phase converter. Then, the control system calculates on a first-phase initial modulated wave of the single-phase converter, a second-phase initial modulated wave of the single-phase converter, and the common-mode modulated-wave change rate to obtain a common-mode modulated wave of the single-phase converter. Further, the control system calculates on the first-phase initial modulated wave, the second-phase initial modulated wave, and the common-mode modulated wave to obtain a pulse width modulated wave of the single-phase converter.

The first level may be a positive-bus level, and the second level may be a negative-bus level.

Both the first-phase initial modulated wave and the second-phase initial modulated wave are sinusoidal waves, and a sum of amplitude of the first-phase initial modulated wave at any moment and amplitude of the second-phase initial modulated wave at the moment is zero.

In this technical solution, the control system obtains the common-mode modulated wave based on initial modulated waves of two bridge arms of the single-phase converter (namely, the first-phase initial modulated wave and the second-phase initial modulated wave). This can avoid use of an algorithm process of a virtual third phase, thereby reducing a time delay, and improving a system response speed and system reliability. In addition, the control system can adjust magnitude and a change slope of a common-mode component based on the voltage corresponding to the direct-current-side positive-bus level and the voltage corresponding to the direct-current-side negative-bus level, and further adjust an action time range of a system DPWM method, thereby improving a system neutral-point potential balancing capability.

In a design solution, that a control system calculates on a voltage corresponding to a first level output by a single-phase converter, a voltage corresponding to a second level output by the single-phase converter, and a voltage reference value about the voltage corresponding to the first level and the voltage corresponding to the second level to obtain a common-mode modulated-wave change rate of the single-phase converter may include obtaining an absolute value of a difference between the voltage corresponding to the first level and the voltage corresponding to the second level, and calculating on the absolute value of the difference and the voltage reference value to obtain the common-mode modulated-wave change rate, where the absolute value of the difference is inversely proportional to the common-mode modulated-wave change rate.

In this design solution, a larger system neutral-point potential deviation degree indicates a smaller common-mode modulated-wave change rate, and a smaller system neutral-point potential deviation degree indicates a larger common-mode modulated-wave change rate. When a system neutral-point potential deviation is relatively large, the control system can proactively reduce a DPWM clamping state ratio to improve a system neutral-point potential balancing capability. When the system neutral-point potential deviation is relatively small, the control system can proactively increase a DPWM clamping state ratio to reduce a system switching loss.

In a design solution, that the control system calculates on the absolute value of the difference and the voltage reference value to obtain the common-mode modulated-wave change rate may include dividing the absolute value of the difference by the voltage reference value to obtain a quotient, and when the quotient is less than or equal to a first preset threshold, determining that the common-mode modulated-wave change rate is a first value.

In a design solution, after the control system divides the absolute value of the difference by the voltage reference value to obtain the quotient, when the quotient is greater than the first preset threshold but less than or equal to a second preset threshold, the control system may determine that the common-mode modulated-wave change rate is a second value, where the second value is less than the first value.

In a design solution, after the control system divides the absolute value of the difference by the voltage reference value to obtain the quotient, when the quotient is greater than the second preset threshold, the control system may determine that the common-mode modulated-wave change rate is a third value, where the third value is less than the second value.

In a design solution, that the control system calculates on the absolute value of the difference and the voltage reference value to obtain the common-mode modulated-wave change rate may include multiplying the absolute value of the difference by a preset adjustment coefficient to obtain a fourth value, subtracting the fourth value from the voltage reference value to obtain a fifth value, and dividing the fifth value by the voltage reference value to obtain the common-mode modulated-wave change rate.

In a design solution, that the control system calculates on a first-phase initial modulated wave of the single-phase converter, a second-phase initial modulated wave of the single-phase converter, and the common-mode modulated-wave change rate to obtain a common-mode modulated wave may include calculating on the second-phase initial modulated wave and the common-mode modulated-wave change rate to obtain a first modulated wave of the single-phase converter, and comparing the first-phase initial modulated wave with the first modulated wave to obtain the common-mode modulated wave.

In a design solution, that the control system calculates on the second-phase initial modulated wave and the common-mode modulated-wave change rate to obtain a first modulated wave of the single-phase converter may include subtracting the second-phase initial modulated wave from a modulated wave of a third level output by the single-phase converter to obtain a second modulated wave of the single-phase converter, and multiplying the second modulated wave by the common-mode modulated-wave change rate to obtain the first modulated wave, where the third level is a zero level.

Then, that the control system compares the first-phase initial modulated wave with the first modulated wave to obtain the common-mode modulated wave may include subtracting the first-phase initial modulated wave from a modulated wave of the first level to obtain a third modulated wave of the single-phase converter, subtracting the first-phase initial modulated wave from a modulated wave of the second level to obtain a fourth modulated wave of the single-phase converter, and comparing the first modulated wave, the third modulated wave, and the fourth modulated wave, to determine the common-mode modulated wave, where amplitude of the common-mode modulated wave at any moment is amplitude with a minimum absolute value among amplitude of the first modulated wave at the moment, amplitude of the third modulated wave at the moment, and amplitude of the fourth modulated wave at the moment.

In this technical solution, the common-mode modulated wave obtained using this embodiment of this application is continuous and does not have a step change, and can effectively reduce a common-mode leakage current, thereby reducing a high-frequency common-mode voltage component.

In a design solution, amplitude of the modulated wave of the first level at any moment, amplitude of the modulated wave of the second level at any moment, amplitude of the modulated wave of the third level at any moment, the amplitude of the first-phase initial modulated wave at any moment, or the amplitude of the second-phase initial modulated wave at any moment is greater than or equal to −1 but less than or equal to 1.

In a design solution, the pulse width modulated wave may include a fifth modulated wave and a sixth modulated wave, and that the control system calculates on the first-phase initial modulated wave, the second-phase initial modulated wave, and the common-mode modulated wave to obtain a pulse width modulated wave of the single-phase converter may include adding the first-phase initial modulated wave and the common-mode modulated wave together to obtain the fifth modulated wave, and adding the second-phase initial modulated wave and the common-mode modulated wave together to obtain the sixth modulated wave.

According to a second aspect, an embodiment of this application provides a single-phase converter control apparatus. The single-phase converter control apparatus has a function of implementing actions of the control system in the single-phase converter control method example described in the first aspect. The function may be implemented by hardware, or may be implemented by executing corresponding software by hardware. The hardware or software includes one or more units or modules corresponding to the foregoing function.

BRIEF DESCRIPTION OF DRAWINGS

To describe the technical solutions in some of the embodiments of this application more clearly, the following describes the accompanying drawings describing some of the embodiments of this application.

DESCRIPTION OF EMBODIMENTS

The following describes the embodiments of this application with reference to the accompanying drawings in the embodiments of this application.

Figure 1:
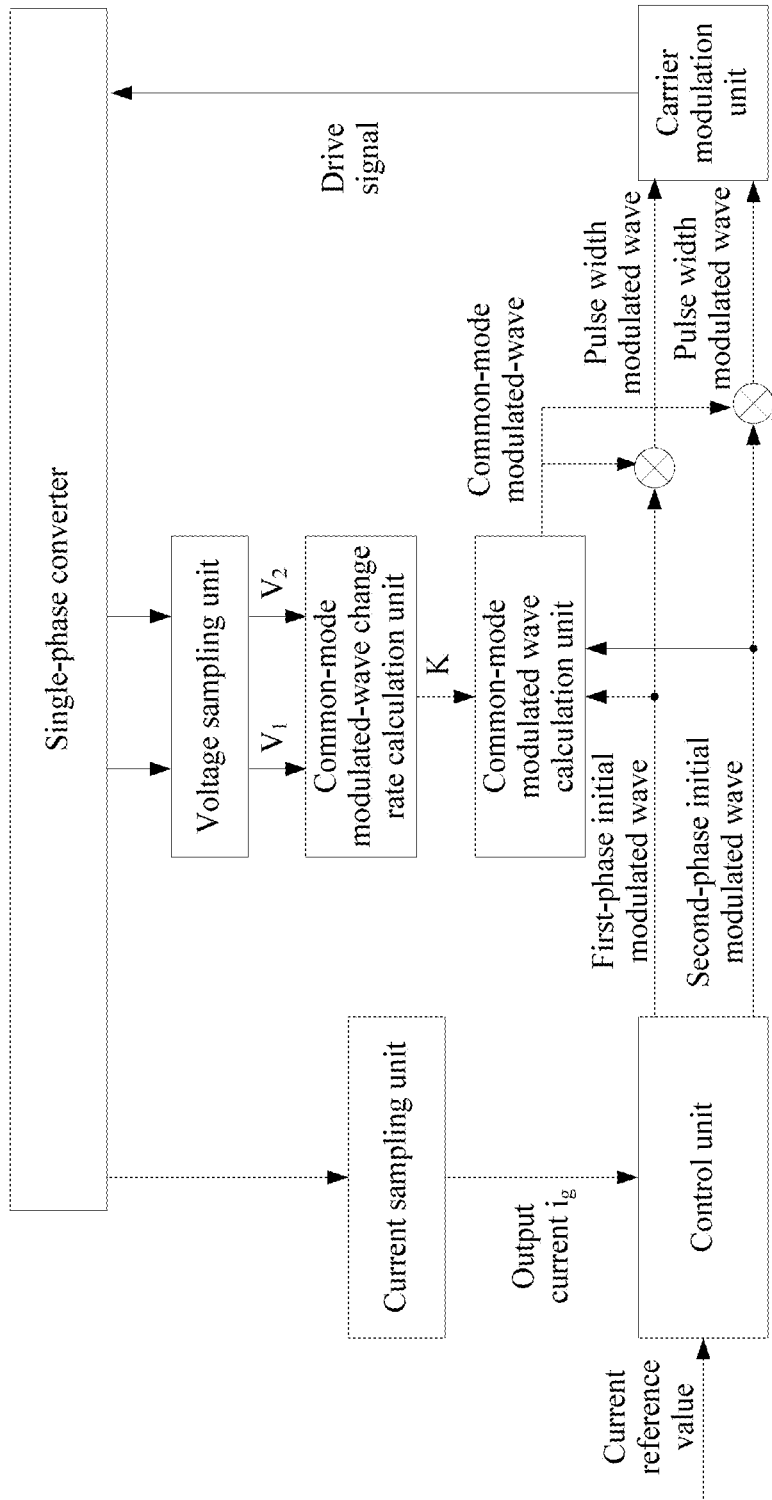
FIG. 1 is a schematic architectural diagram of a single-phase converter control system disclosed in an embodiment of this application.

For a better understanding of a single-phase converter control method and apparatus disclosed in the embodiments of this application, the following first describes a network architecture applicable to the embodiments of this application. FIG. 1 is a schematic architectural diagram of a single-phase converter control system disclosed in an embodiment of this application. As shown in FIG. 1, the single-phase converter control system may include a single-phase converter, a voltage sampling unit, a common-mode modulated-wave change rate calculation unit, a common-mode modulated wave calculation unit, a current sampling unit, a control unit, and a carrier modulation unit. The single-phase converter is separately connected to the voltage sampling unit, the current sampling unit, and the carrier modulation unit. The voltage sampling unit is connected to the common-mode modulated-wave change rate calculation unit. The common-mode modulated-wave change rate calculation unit is connected to the common-mode modulated wave calculation unit. The current sampling unit is connected to the control unit. The control unit is separately connected to the common-mode modulated wave calculation unit and the carrier modulation unit.

The voltage sampling unit is configured to obtain, from the single-phase converter, a voltage corresponding to a direct-current-side positive-bus level and a voltage corresponding to a direct-current-side negative-bus level, and send the voltage corresponding to the direct-current-side positive-bus level and the voltage corresponding to the direct-current-side negative-bus level to the common-mode modulated-wave change rate calculation unit.

The current sampling unit is configured to obtain an output current (for example, $i_g$ in FIG. 2) from the single-phase converter, and send the output current to the control unit.

The common-mode modulated-wave change rate calculation unit is configured to perform calculation on the voltage corresponding to the direct-current-side positive-bus level (for example, $V_1$ in FIG. 2), the voltage corresponding to the direct-current-side negative-bus level (for example, $V_2$ in FIG. 2), and a voltage reference value about the voltage corresponding to a first level and the voltage corresponding to a second level to obtain a common-mode modulated-wave change rate (K), and send the common-mode modulated-wave change rate to the common-mode modulated wave calculation unit.

The control unit is configured to perform calculation on the output current and a current reference value to obtain a first-phase initial modulated wave of the single-phase converter and a second-phase initial modulated wave of the single-phase converter, and send the first-phase initial modulated wave and the second-phase initial modulated wave to the common-mode modulated wave calculation unit.

The common-mode modulated wave calculation unit is configured to perform calculation on the first-phase initial modulated wave, the second-phase initial modulated wave, and the common-mode modulated-wave change rate to obtain a common-mode modulated wave.

The first-phase initial modulated wave and the second-phase initial modulated wave that are output by the control unit, and the common-mode modulated wave that is output by the common-mode modulated wave calculation unit are processed to obtain a pulse width modulated wave. The pulse width modulated wave is output to the carrier modulation unit.

The carrier modulation unit is configured to output a drive signal to the single-phase converter based on the pulse width modulated wave to control different on/off states of switch assemblies (for example, $S_a$ and $S_b$ in FIG. 2) in the single-phase converter such that the single-phase converter outputs different voltages.

Figure 2:
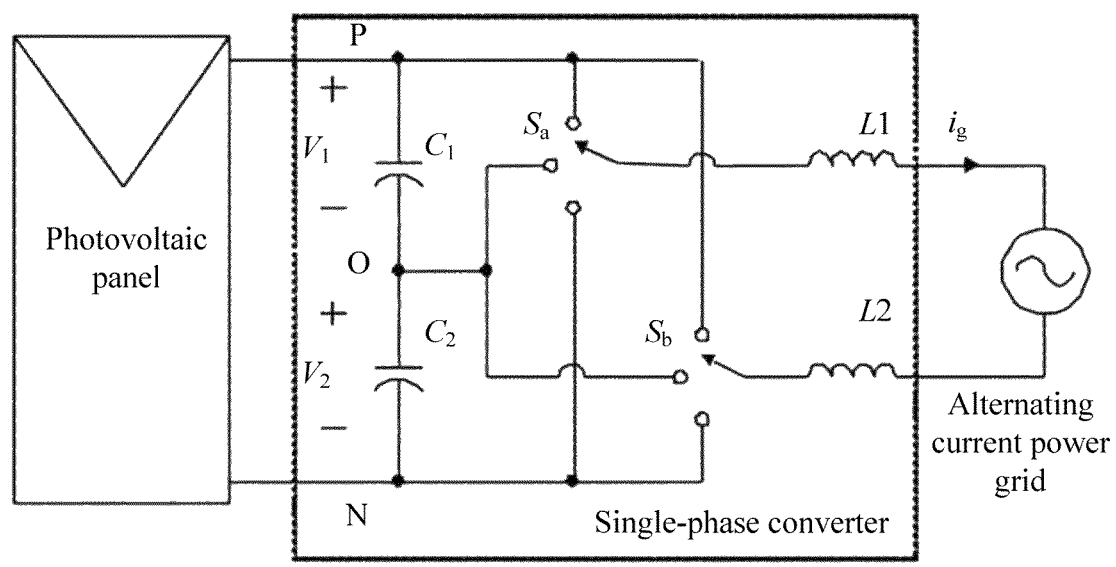
FIG. 2 is a schematic structural diagram of a single-phase three-level photovoltaic grid-tied system disclosed in an embodiment of this application.

A schematic structural diagram of a single-phase three-level photovoltaic grid-tied system shown in FIG. 2 is used as an example. The single-phase three-level photovoltaic grid-tied system may include a photovoltaic panel, a single-phase converter, and an alternating current power grid. A direct current side of the single-phase converter is connected to the photovoltaic panel, and an alternating current side of the single-phase converter is connected to the alternating current power grid using a filter inductor (for example, L1 or L2). The single-phase three-level photovoltaic grid-tied system converts a direct current generated by the photovoltaic panel into an alternating current and inputs the alternating current into the alternating current power grid.

In the single-phase converter shown in FIG. 2, a positive electrode of a capacitor $C_1$ is separately connected to the photovoltaic panel, a switch assembly $S_a$, and a switch assembly $S_b$, a negative electrode of the capacitor $C_1$ is separately connected to a positive electrode of a capacitor $C_2$, the switch assembly $S_a$, and the switch assembly $S_b$, a negative electrode of the capacitor $C_2$ is separately connected to the photovoltaic panel, the switch assembly $S_a$, and the switch assembly $S_b$, the switch assembly $S_a$ is connected a filter inductor L1, the filter inductor L1 is connected to the alternating current power grid, the switch assembly $S_b$ is connected to a filter inductor L2, and the filter inductor L2 is connected to the alternating current power grid. A current output by the filter inductor L1 (or L2) is an output current $i_g$.

On a direct current bus side of the single-phase converter, voltage division is implemented using the two capacitors $C_1$ and $C_2$. Bridge arms of two phases implement electric energy conversion between the direct current side and the alternating current side using the switch assemblies $S_a$ and $S_b$. Three levels may be output at an alternating current port by controlling different on/off states of the switch assemblies of the bridge arms. For example, if $S_a$ is connected to a positive-bus point P, a level output by a phase A (namely, a first phase) is a positive-bus level, if $S_a$ is connected to a bus neutral point O, a level output by a phase A is a zero level, or if $S_a$ is connected to a negative-bus point N, a level output by a phase A is a negative level. For another example, if $S_b$ is connected to a positive-bus point P, a level output by a phase B (namely, a second phase) is a positive-bus level, if $S_b$ is connected to a bus neutral point O, a level output by a phase B is a zero level, or if $S_b$ is connected to a negative-bus point N, a level output by a phase B is a negative level.

It should be noted that a single-phase energy storage system has a structure similar to that of the single-phase three-level photovoltaic grid-tied system. After the photovoltaic panel in FIG. 2 is replaced with a storage battery, a schematic structural diagram of the single-phase energy storage system is obtained. The single-phase energy storage system is used to implement bidirectional energy exchange between an alternating current power grid and a storage battery.

Figure 3:
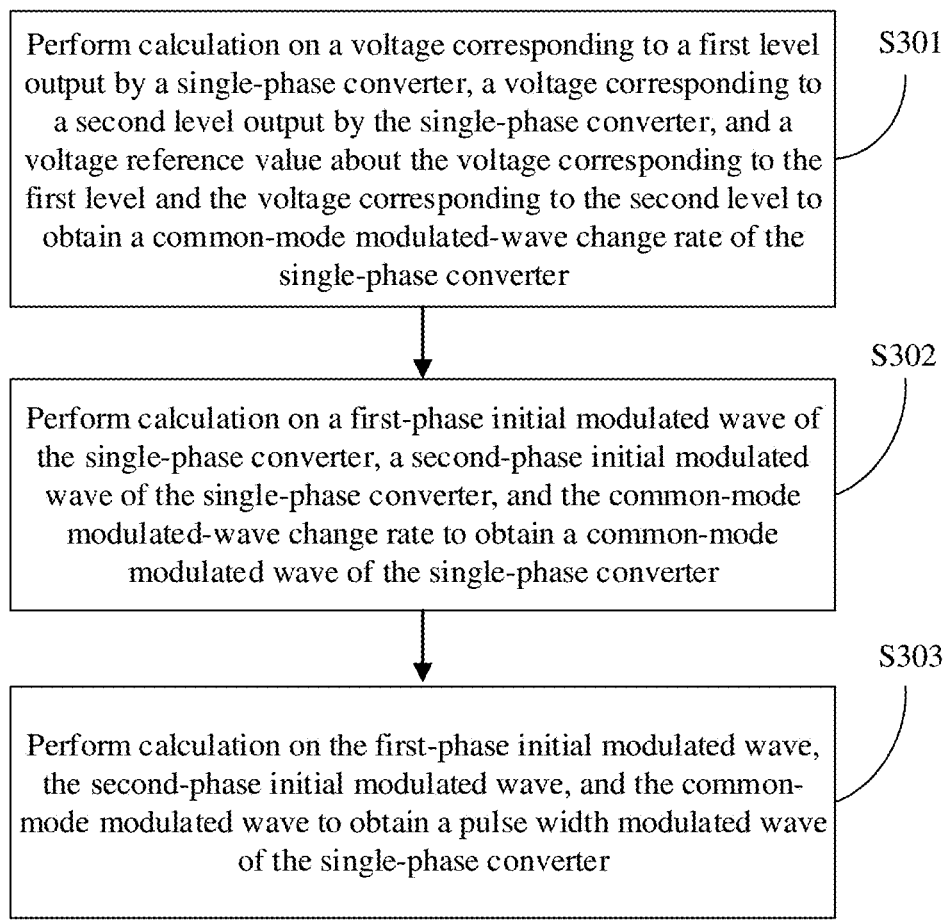
FIG. 3 is a schematic flowchart of a single-phase converter control method disclosed in an embodiment of this application.

Based on the schematic architectural diagram of the single-phase converter control system shown in FIG. 1, FIG. 3 shows a single-phase converter control method according to an embodiment of this application. The method includes but is not limited to the following steps.

Step S301: Perform calculation on a voltage corresponding to a first level output by a single-phase converter, a voltage corresponding to a second level output by the single-phase converter, and a voltage reference value about the voltage corresponding to the first level and the voltage corresponding to the second level to obtain a common-mode modulated-wave change rate of the single-phase converter, where the first level is a direct-current-side positive-bus level, and the second level is a direct-current-side negative-bus level.

Further, the control system may obtain an absolute value of a difference between the voltage corresponding to the direct-current-side positive-bus level of the single-phase converter and the voltage corresponding to the direct-current-side negative-bus level of the single-phase converter, and perform calculation on the absolute value of the difference and the voltage reference value to obtain the common-mode modulated-wave change rate. The absolute value of the difference is inversely proportional to the common-mode modulated-wave change rate. For example, the voltage reference value may be an arithmetic average value of the voltage corresponding to the direct-current-side positive-bus level and the voltage corresponding to the direct-current-side negative-bus level.

There are two manners for calculating the common-mode modulated-wave change rate. For details, refer to the following descriptions.

1. A first manner for calculating the common-mode modulated-wave change rate may be obtaining the absolute value of the difference between the voltage corresponding to the direct-current-side positive-bus level and the voltage corresponding to the direct-current-side negative-bus level, dividing the absolute value of the difference by the voltage reference value to obtain a quotient, determining that the common-mode modulated-wave change rate is a first value when the quotient is less than or equal to a first preset threshold, determining that the common-mode modulated-wave change rate is a second value when the quotient is greater than a first preset threshold but less than or equal to a second preset threshold, and determining that the common-mode modulated-wave change rate is a third value when the quotient is greater than a second preset threshold, where the second value is less than the first value, and the third value is less than the second value.

Figure 4:
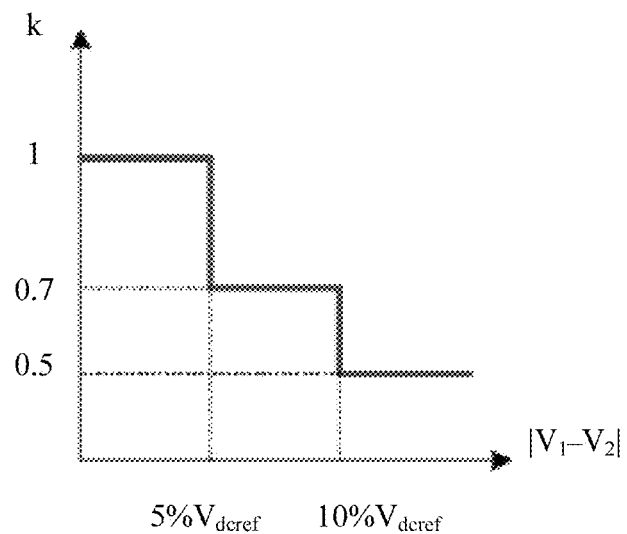
FIG. 4 is a schematic diagram of a common-mode modulated wave change rate disclosed in an embodiment of this application.

In this embodiment of this application, the common-mode modulated-wave change rate decreases with an increase in the deviation between the voltage corresponding to the direct-current-side positive-bus level and the voltage corresponding to the direct-current-side negative-bus level. A relationship between the common-mode modulated-wave change rate and the deviation is a piecewise function. For example, the manner for calculating the common-mode modulated-wave change rate may be shown as follows:

$$K = \begin{cases} 0.5 & \frac{|V_1 - V_2|}{V_{dcref}} > 10\% \\ 0.7 & 10\% \geq \frac{|V_1 - V_2|}{V_{dcref}} > 5\% \\ 1 & 5\% \geq \frac{|V_1 - V_2|}{V_{dcref}} \end{cases},$$

where K represents the common-mode modulated-wave change rate, $V_1$ represents the voltage corresponding to the direct-current-side positive-bus level, $V_2$ represents the voltage corresponding to the direct-current-side negative-bus level, and $V_{dcref}$ represents the voltage reference value. For example, the first preset threshold may be 5%, the second preset threshold may be 10%, the first value may be 1, the second value may be 0.7, and the third value may be 0.5. A schematic diagram of the common-mode modulated-wave change rate obtained using the foregoing piecewise function may be shown in FIG. 4. When the quotient obtained by dividing the absolute value of the difference by the voltage reference value is less than or equal to 5%, it is determined that the common-mode modulated-wave change rate is 1, when the quotient obtained by dividing the absolute value of the difference by the voltage reference value is greater than 5% but less than or equal to 10%, it is determined that the common-mode modulated-wave change rate is 0.7, or when the quotient obtained by dividing the absolute value of the difference by the voltage reference value is greater than 10%, it is determined that the common-mode modulated-wave change rate is 0.5.

It should be noted that the first preset threshold, the second preset threshold, the first value, the second value, and the third value in this embodiment of this application are only examples. For example, the first preset threshold may be 6%, the second preset threshold may be 11%, the first value may be 1, the second value may be 0.8, and the third value may be 0.3, and so on. This embodiment of this application is not limited thereto.

2. A second manner for calculating the common-mode modulated-wave change rate may be obtaining the absolute value of the difference between the voltage corresponding to the direct-current-side positive-bus level and the voltage corresponding to the direct-current-side negative-bus level, multiplying the absolute value of the difference by a preset adjustment coefficient to obtain a fourth value, subtracting the fourth value from the voltage reference value to obtain a fifth value, and dividing the fifth value by the voltage reference value to obtain the common-mode modulated-wave change rate.

Figure 5:
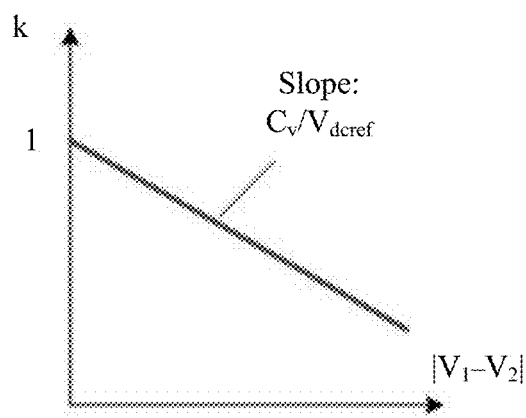
FIG. 5 is a schematic diagram of a common-mode modulated wave change rate disclosed in another embodiment of this application.

In this embodiment of this application, the common-mode modulated-wave change rate decreases with an increase in the deviation between the voltage corresponding to the direct-current-side positive-bus level and the voltage corresponding to the direct-current-side negative-bus level. A relationship between the common-mode modulated-wave change rate and the deviation is an inversely proportional linear relationship. For example, the manner for calculating the common-mode modulated-wave change rate may be shown as follows:

$$K = 1 - \frac{|V_1 - V_2| * C_V}{V_{dcref}},$$

where K represents the common-mode modulated-wave change rate, $V_1$ represents the voltage corresponding to the direct-current-side positive-bus level, $V_2$ represents the voltage corresponding to the direct-current-side negative-bus level, $V_{dcref}$ represents the voltage reference value, and $C_v$ represents the preset adjustment coefficient. For example, $C_v$ may be 10. A schematic diagram of the common-mode modulated-wave change rate obtained using the foregoing formula may be shown in FIG. 5. When the absolute value of the difference between the voltage corresponding to the direct-current-side positive-bus level and the voltage corresponding to the direct-current-side negative-bus level is 0, it is determined that the common-mode modulated-wave change rate is 1. In a mutual relationship, shown in FIG. 5, between the common-mode modulated-wave change rate and the absolute value of the difference between the voltage corresponding to the direct-current-side positive-bus level and the voltage corresponding to the direct-current-side negative-bus level, a slope is $C_v/V_{dcref}$.

It should be noted that the preset adjustment coefficient in this embodiment of this application includes but is not limited to 10. For example, the preset adjustment coefficient may be 8, 15, or the like. This embodiment of this application is not limited thereto.

Step S302: Perform calculation on a first-phase initial modulated wave of the single-phase converter, a second-phase initial modulated wave of the single-phase converter, and the common-mode modulated-wave change rate to obtain a common-mode modulated wave.

Figure 6:
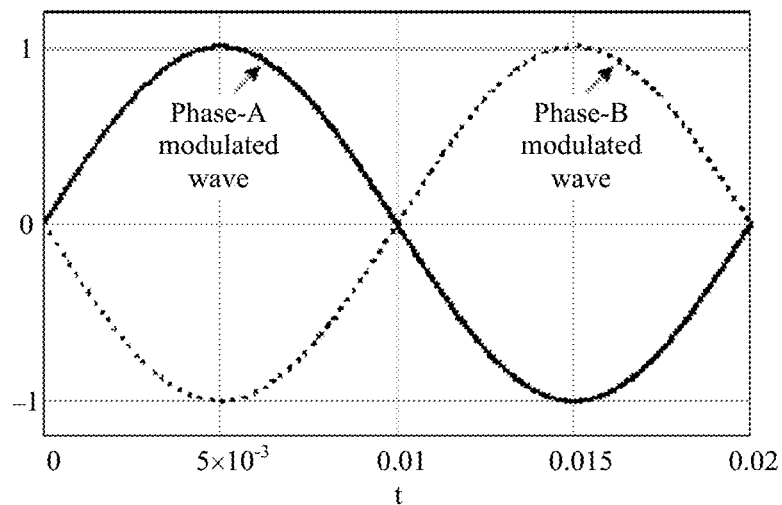
FIG. 6 is a schematic waveform diagram of an initial modulated wave disclosed in an embodiment of this application.

In an implementation, the control system may perform calculation on the second-phase initial modulated wave and the common-mode modulated-wave change rate to obtain a first modulated wave, and compare the first-phase initial modulated wave with the first modulated wave to obtain the common-mode modulated wave. A schematic waveform diagram of an initial modulated wave shown in FIG. 6 is used as an example. Both the first-phase initial modulated wave and the second-phase initial modulated wave are sinusoidal waves. Amplitude of the first-phase initial modulated wave at any moment is greater than or equal to −1 but less than or equal to 1, and amplitude of the second-phase initial modulated wave at any moment is greater than or equal to −1 but less than or equal to 1. The first-phase initial modulated wave and the second-phase initial modulated wave meet the following relationship. A sum of the amplitude of the first-phase initial modulated wave at any moment and the amplitude of the second-phase initial modulated wave at the moment is zero, i.e., $V_a=-V_b$, where $V_a$ represents the first-phase initial modulated wave, and $V_b$ represents the second-phase initial modulated wave.

A specific implementation in which the control system calculates on the second-phase initial modulated wave and the common-mode modulated-wave change rate to obtain the first modulated wave may be subtracting the second-phase initial modulated wave from a modulated wave of a third level output by the single-phase converter to obtain a second modulated wave of the single-phase converter, and multiplying the second modulated wave by the common-mode modulated-wave change rate to obtain the first modulated wave, where the third level is a zero level. It should be noted that the modulated wave of the third level in this embodiment of this application may be obtained after normalization processing is performed on the modulated wave of the third level output by the single-phase converter. That is, a voltage of the modulated wave of the third level in this embodiment of this application at any moment is 0. In this case, the first modulated wave may be $-K \times V_b = K \times V_a$.

Then, a specific implementation in which the control system compares the first-phase initial modulated wave with the first modulated wave to obtain the common-mode modulated wave may be subtracting the first-phase initial modulated wave from a modulated wave of the first level to obtain a third modulated wave of the single-phase converter, subtracting the first-phase initial modulated wave from a modulated wave of the second level to obtain a fourth modulated wave of the single-phase converter, and comparing the first modulated wave, the third modulated wave, and the fourth modulated wave, to determine the common-mode modulated wave, where amplitude of the common-mode modulated wave at any moment is amplitude with a minimum absolute value among amplitude of the first modulated wave at the moment, amplitude of the third modulated wave at the moment, and amplitude of the fourth modulated wave at the moment.

It should be noted that the modulated wave of the first level in this embodiment of this application may be obtained after normalization processing is performed on the modulated wave of the first level output by the single-phase converter. That is, a voltage of the modulated wave of the first level in this embodiment of this application at any moment is 1. In this case, the third modulated wave may be $1-V_a$. The modulated wave of the second level in this embodiment of this application may be obtained after normalization processing is performed on the modulated wave of the second level output by the single-phase converter. That is, a voltage of the modulated wave of the second level in this embodiment of this application at any moment is −1. In this case, the third modulated wave may be $-1-V_a$.

Figure 7A:
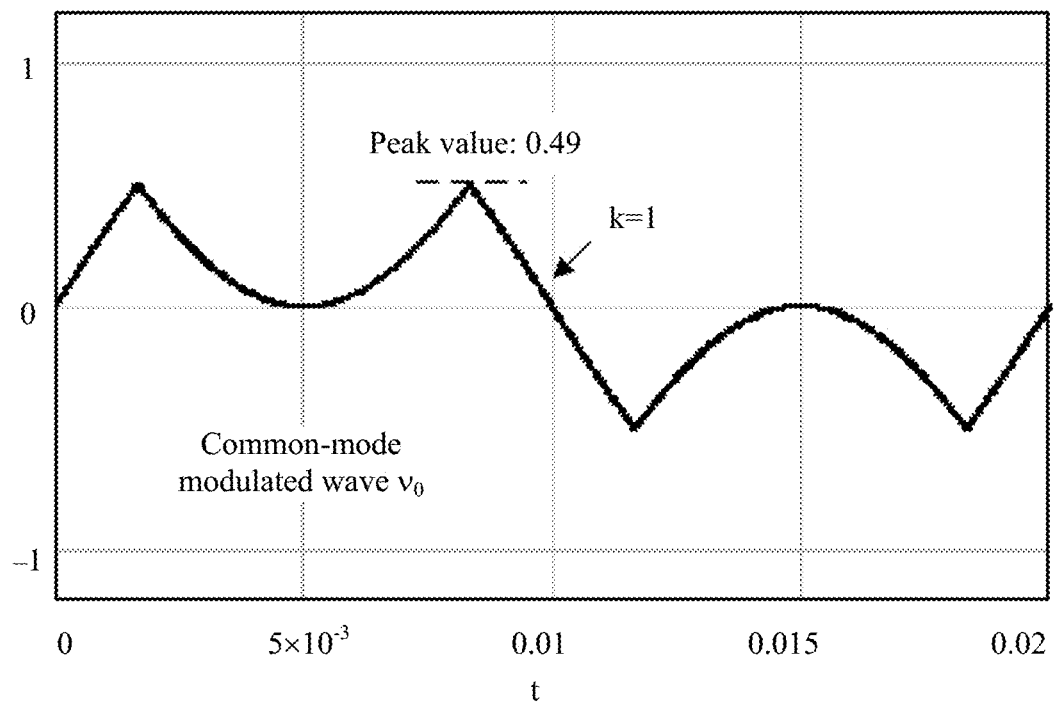
FIG. 7A is a schematic waveform diagram of a common-mode modulated wave disclosed in an embodiment of this application.

When k=1, a schematic waveform diagram of the common-mode modulated wave obtained using the foregoing method may be shown in FIG. 7A. When k=0.7, a schematic waveform diagram of the common-mode modulated wave obtained using the foregoing method may be shown in FIG. 7B. When k=0.5, a schematic waveform diagram of the common-mode modulated wave obtained using the foregoing method may be shown in FIG. 7C. It may be learned from FIG. 7A to FIG. 7C that regardless of a degree of the deviation between the voltage corresponding to the first level and the voltage corresponding to the second level, the obtained common-mode modulated wave is continuous and does not have a step change, and a smaller common-mode modulated wave change rate indicates a smaller peak value of a common-mode injection amount and a smoother change between a positive peak value and a negative peak value.

In another implementation, the control system may perform calculation on the first-phase initial modulated wave and the common-mode modulated-wave change rate to obtain a seventh modulated wave of the single-phase converter, and compare the second-phase initial modulated wave with the seventh modulated wave to obtain the common-mode modulated wave. The first-phase initial modulated wave (namely, a phase-A modulated wave) and the second-phase initial modulated wave (namely, a phase-B modulated wave) in this embodiment of this application may be shown in FIG. 6.

A specific implementation in which the control system calculates on the first-phase initial modulated wave and the common-mode modulated-wave change rate to obtain the seventh modulated wave of the single-phase converter may be subtracting the first-phase initial modulated wave from a modulated wave of a third level to obtain an eighth modulated wave of the single-phase converter, and multiplying the eighth modulated wave by the common-mode modulated-wave change rate to obtain the seventh modulated wave. That is, the seventh modulated wave may be $-K \times V_a$.

Then, a specific implementation in which the control system compares the second-phase initial modulated wave with the seventh modulated wave to obtain the common-mode modulated wave may be subtracting the second-phase initial modulated wave from a modulated wave of the first level to obtain a ninth modulated wave, subtracting the second-phase initial modulated wave from a modulated wave of the second level to obtain a tenth modulated wave, and comparing the seventh modulated wave, the ninth modulated wave, and the tenth modulated wave, to determine the common-mode modulated wave, where amplitude of the common-mode modulated wave at any moment is amplitude with a minimum absolute value among amplitude of the seventh modulated wave at the moment, amplitude of the ninth modulated wave at the moment, and amplitude of the tenth modulated wave at the moment. The ninth modulated wave may be $1-V_b=1+V_a$, and the tenth modulated wave may be $-1-V_b=-1+V_a$.

Figure 7B:
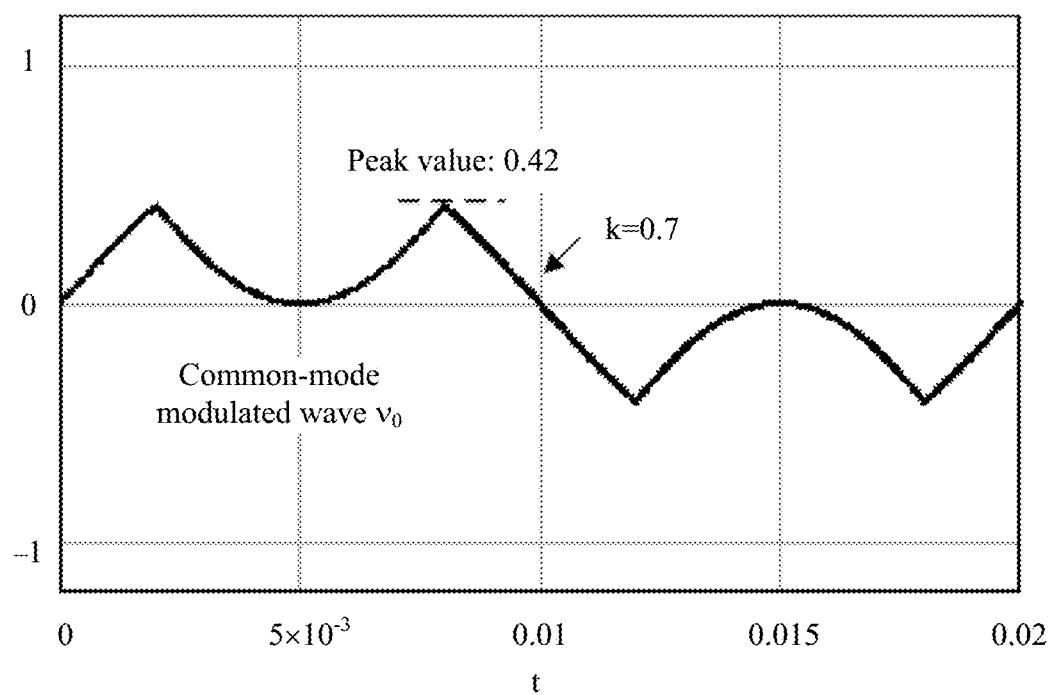
FIG. 7B is a schematic waveform diagram of a common-mode modulated wave disclosed in another embodiment of this application.
Figure 7C:
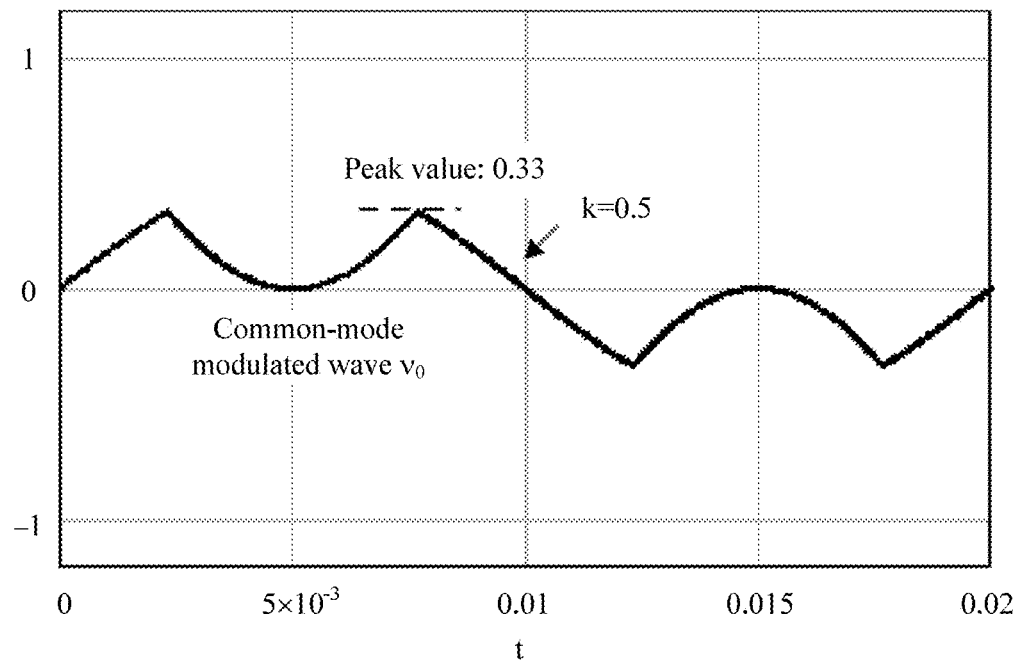
FIG. 7C is a schematic waveform diagram of a common-mode modulated wave disclosed in another embodiment of this application.

The common-mode modulated wave obtained using the foregoing method is symmetrical with the common-mode modulated waves shown in FIG. 7A to FIG. 7C on a lateral axis. Regardless of a degree of the deviation between the voltage corresponding to the first level and the voltage corresponding to the second level, the obtained common-mode modulated wave is continuous and does not have a step change, and a smaller common-mode modulated wave change rate indicates a smaller peak value of a common-mode injection amount and a smoother change between a positive peak value and a negative peak value.

Step S303: Perform calculation on the first-phase initial modulated wave, the second-phase initial modulated wave, and the common-mode modulated wave to obtain a pulse width modulated wave.

Further, the control system may add the first-phase initial modulated wave and the common-mode modulated wave together to obtain a fifth modulated wave, and add the second-phase initial modulated wave and the common-mode modulated wave together to obtain a sixth modulated wave. The fifth modulated wave and the sixth modulated wave form the pulse width modulated wave.

Figure 8A:
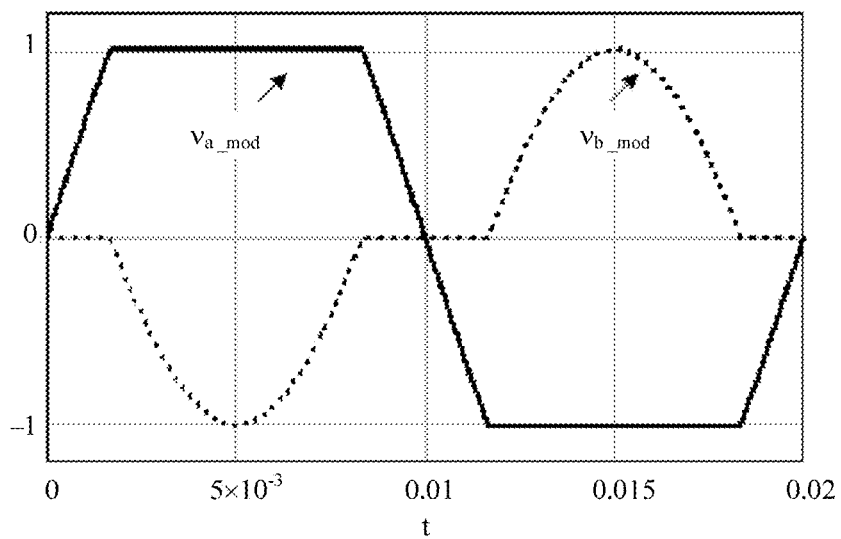
FIG. 8A is a schematic waveform diagram of a pulse width modulated wave disclosed in an embodiment of this application.

When the quotient obtained by dividing the absolute value of the difference between the voltage corresponding to the first level and the voltage corresponding to the second level by the voltage reference value is less than or equal to 5%, a schematic waveform diagram of an obtained pulse width modulated wave may be shown in FIG. 8A, where $v_{a\_mod}$ represents the fifth modulated wave, and $v_{b\_mod}$ represents the sixth modulated wave. $v_{a\_mod}$ has obvious clamping states 1 and −1, and $v_{b\_mod}$ has an obvious clamping state 0. The three clamping states alternately appear, to ensure that at any moment, there is a phase whose bridge arm is in a clamping state. A clamping time of the phase A accounts for 70% of an entire power frequency cycle.

Figure 8B:
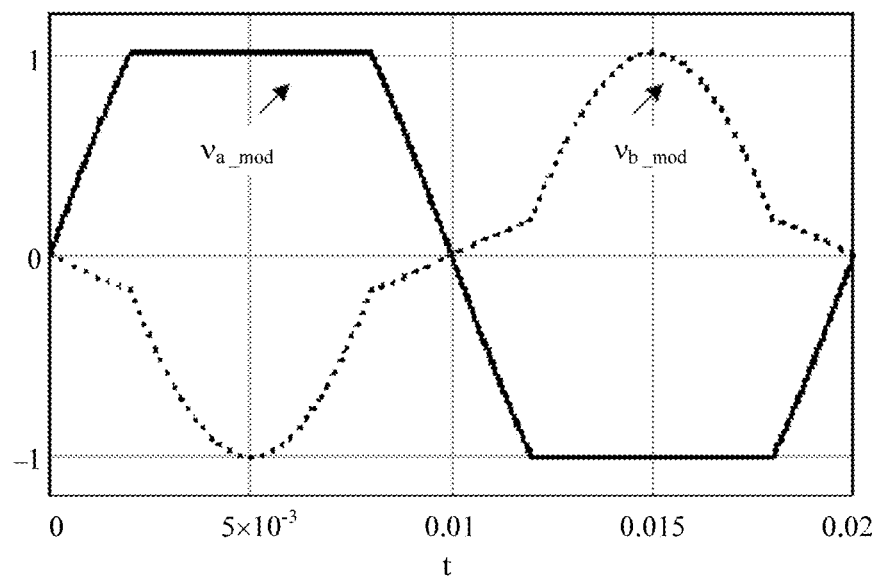
FIG. 8B is a schematic waveform diagram of a pulse width modulated wave disclosed in another embodiment of this application.

When the quotient obtained by dividing the absolute value of the difference between the voltage corresponding to the first level and the voltage corresponding to the second level by the voltage reference value is greater than 5% but less than or equal to 10%, a schematic waveform diagram of an obtained pulse width modulated wave may be shown in FIG. 8B. $v_{a\_mod}$ has obvious clamping states 1 and −1, but $v_{b\_mod}$ already does not have a clamping state 0. A clamping time of the phase A is shortened to 62% of an entire power frequency cycle.

Figure 8C:
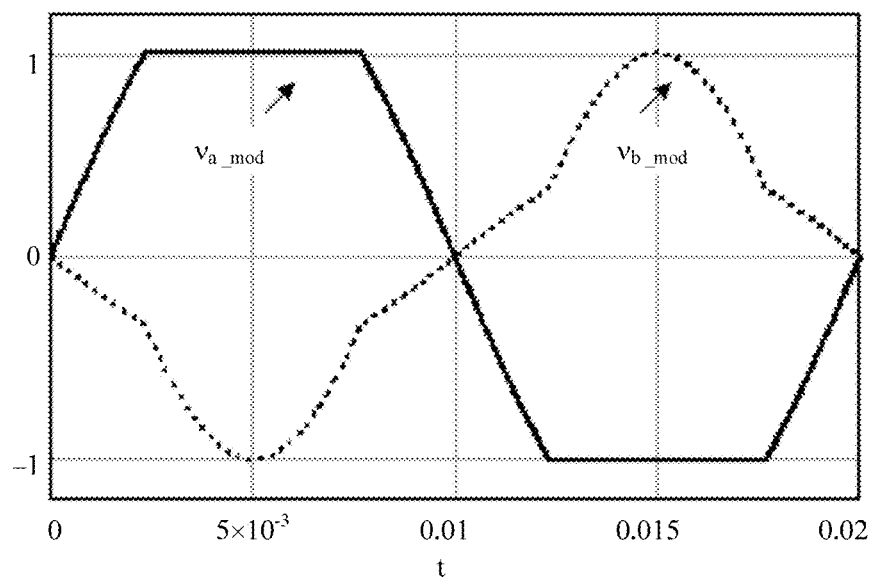
FIG. 8C is a schematic waveform diagram of a pulse width modulated wave disclosed in another embodiment of this application.

When the quotient obtained by dividing the absolute value of the difference between the voltage corresponding to the first level and the voltage corresponding to the second level by the voltage reference value is greater than 10%, a schematic waveform diagram of an obtained pulse width modulated wave may be shown in FIG. 8C. A clamping time of the phase A is further shortened to only 54% of an entire power frequency cycle.

After FIG. 8A, FIG. 8B, and FIG. 8C are compared, it can be learned that the single-phase converter control method provided in this application can be used to adaptively adjust a modulation method based on a system neutral-point potential deviation (i.e., a degree of the deviation between the voltage corresponding to the first level and the voltage corresponding to the second level). When the system neutral-point potential deviation is relatively large, a DPWM clamping state ratio may be automatically reduced, to improve a system neutral-point potential balancing capability, and when the system neutral-point potential deviation is relatively small, the DPWM clamping state ratio may be automatically increased, to reduce a system switching loss.

Figure 9:
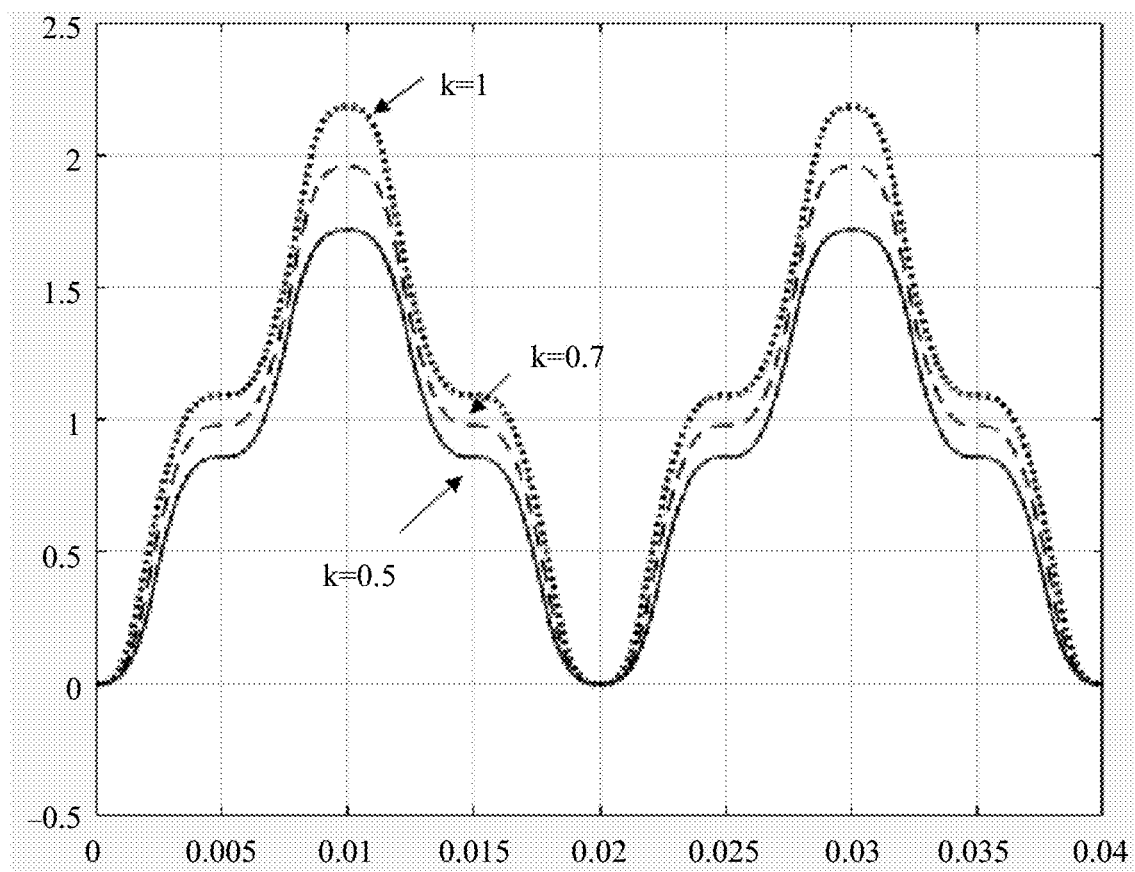
FIG. 9 is a schematic diagram of a relative fluctuation of neutral-point potential disclosed in an embodiment of this application.

When K=1, 0.5, or 0.7, a relative fluctuation of neutral-point potential may be shown in FIG. 9. It can be learned that when k=1, a peak value of a system neutral-point potential fluctuation is the largest, when K=0.7, a peak value of the system neutral-point potential fluctuation is 86% of the peak value obtained when k=1, and when K=0.5, a peak value of the system neutral-point potential fluctuation decreases greatly, and is only 77% of the peak value obtained when k=1. If a value of K further decreases, the peak value of the system neutral-point potential fluctuation further decreases. It can indicate that the single-phase converter control method provided in this application can change the system neutral-point potential fluctuation by adjusting the common-mode modulated wave change rate in order to further change a system neutral-point potential balancing capability.

In the method described in FIG. 3, calculation is performed on the voltage corresponding to the first level, the voltage corresponding to the second level, and the voltage reference value to obtain the common-mode modulated-wave change rate, and calculation is performed on the first-phase initial modulated wave, the second-phase initial modulated wave, and the common-mode modulated-wave change rate to obtain the common-mode modulated wave. This can avoid use of an algorithm process of a virtual third phase, thereby reducing a time delay, and improving a system response speed and system reliability. In addition, magnitude and a change slope of a common-mode component can be adjusted based on the voltage corresponding to the first level and the voltage corresponding to the second level, and an action time range of a system DPWM method can be further adjusted, thereby improving a system neutral-point potential balancing capability.

The foregoing describes the method of the embodiments of this application in detail, and the following provides an apparatus of the embodiments of this application.

Figure 10:
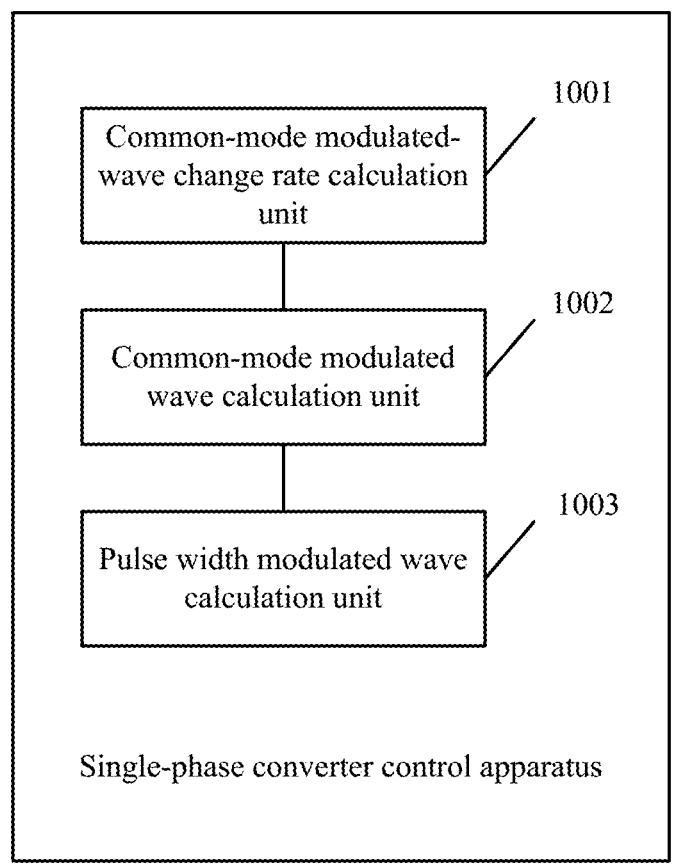
FIG. 10 is a schematic structural diagram of a single-phase converter control apparatus disclosed in an embodiment of this application.

FIG. 10 is a schematic structural diagram of a single-phase converter control apparatus according to an embodiment of this application. The single-phase converter control apparatus is configured to perform the method in the embodiment shown in FIG. 3. The single-phase converter control apparatus may include a common-mode modulated-wave change rate calculation unit 1001, a common-mode modulated wave calculation unit 1002, and a pulse width modulated wave calculation unit 1003. A detailed description of each unit is as follows.

The common-mode modulated-wave change rate calculation unit 1001 is configured to perform calculation on a voltage corresponding to a first level output by a single-phase converter, a voltage corresponding to a second level output by the single-phase converter, and a voltage reference value about the voltage corresponding to the first level and the voltage corresponding to the second level to obtain a common-mode modulated-wave change rate of the single-phase converter, where the first level is a direct-current-side positive-bus level, and the second level is a direct-current-side negative-bus level.

The common-mode modulated wave calculation unit 1002 is configured to perform calculation on a first-phase initial modulated wave of the single-phase converter, a second-phase initial modulated wave of the single-phase converter, and the common-mode modulated-wave change rate to obtain a common-mode modulated wave of the single-phase converter.

The pulse width modulated wave calculation unit 1003 is configured to perform calculation on the first-phase initial modulated wave, the second-phase initial modulated wave, and the common-mode modulated wave to obtain a pulse width modulated wave.

Optionally, the common-mode modulated-wave change rate calculation unit 1001 is further configured to obtain an absolute value of a difference between the voltage corresponding to the first level and the voltage corresponding to the second level, and perform calculation on the absolute value of the difference and the voltage reference value to obtain the common-mode modulated-wave change rate, where the absolute value of the difference is inversely proportional to the common-mode modulated-wave change rate.

Optionally, the common-mode modulated-wave change rate calculation unit 1001 calculates on the absolute value of the difference and the voltage reference value to obtain the common-mode modulated-wave change rate, and is further configured to divide the absolute value of the difference by the voltage reference value to obtain a quotient, and determine that the common-mode modulated-wave change rate is a first value when the quotient is less than or equal to a first preset threshold.

Optionally, after dividing the absolute value of the difference by the voltage reference value to obtain the quotient, the common-mode modulated-wave change rate calculation unit 1001 is further configured to determine that the common-mode modulated-wave change rate is a second value when the quotient is greater than the first preset threshold but less than or equal to a second preset threshold, where the second value is less than the first value.

Optionally, after dividing the absolute value of the difference by the voltage reference value to obtain the quotient, the common-mode modulated-wave change rate calculation unit 1001 is further configured to determine that the common-mode modulated-wave change rate is a third value when the quotient is greater than the second preset threshold, where the third value is less than the second value.

Optionally, the common-mode modulated-wave change rate calculation unit 1001 calculates on the absolute value of the difference and the voltage reference value to obtain the common-mode modulated-wave change rate, and is further configured to multiply the absolute value of the difference by a preset adjustment coefficient to obtain a fourth value, subtract the fourth value from the voltage reference value to obtain a fifth value, and divide the fifth value by the voltage reference value to obtain the common-mode modulated-wave change rate.

Optionally, the common-mode modulated wave calculation unit 1002 is configured to perform calculation on the second-phase initial modulated wave and the common-mode modulated-wave change rate to obtain a first modulated wave, and compare the first-phase initial modulated wave with the first modulated wave to obtain the common-mode modulated wave.

Optionally, the common-mode modulated wave calculation unit 1002 calculates on the second-phase initial modulated wave and the common-mode modulated-wave change rate to obtain the first modulated wave, and is further configured to subtract the second-phase initial modulated wave from a modulated wave of a third level output by the single-phase converter to obtain a second modulated wave of the single-phase converter, and multiply the second modulated wave by the common-mode modulated-wave change rate to obtain the first modulated wave, where the third level is a zero level.

The common-mode modulated wave calculation unit 1002 compares the first-phase initial modulated wave with the first modulated wave to obtain the common-mode modulated wave, and is further configured to subtract the first-phase initial modulated wave from a modulated wave of the first level to obtain a third modulated wave of the single-phase converter, subtract the first-phase initial modulated wave from a modulated wave of the second level to obtain a fourth modulated wave of the single-phase converter, and compare the first modulated wave, the third modulated wave, and the fourth modulated wave, to determine the common-mode modulated wave, where amplitude of the common-mode modulated wave at any moment is amplitude with a minimum absolute value among amplitude of the first modulated wave at the moment, amplitude of the third modulated wave at the moment, and amplitude of the fourth modulated wave at the moment.

Optionally, amplitude of the modulated wave of the first level at any moment, amplitude of the modulated wave of the second level at any moment, amplitude of the modulated wave of the third level at any moment, amplitude of the first-phase initial modulated wave at any moment, or amplitude of the second-phase initial modulated wave at any moment is greater than or equal to −1 but less than or equal to 1.

Optionally, the pulse width modulated wave includes a fifth modulated wave and a sixth modulated wave, and the pulse width modulated wave calculation unit 1003 is configured to add the first-phase initial modulated wave and the common-mode modulated wave together to obtain the fifth modulated wave, and add the second-phase initial modulated wave and the common-mode modulated wave together to obtain the sixth modulated wave.

It should be noted that for implementation of each module, reference may be further made to a corresponding description of the embodiment shown in FIG. 3 correspondingly.

It should be noted that unit division in the embodiments of this application is an example, and is merely logical function division and may be other division in actual implementation. Functional units in the embodiments of this application may be integrated into one unit, or each of the units may exist alone physically, or two or more units are integrated into one module. The integrated unit may be implemented in a form of hardware, or may be implemented in a form of a software function module.

All or some of the foregoing embodiments may be implemented through software, hardware, firmware, or any combination thereof. When software is used to implement the embodiments, the embodiments may be implemented completely or partially in a form of a computer program product. The computer program product includes one or more computer instructions. When the computer program instructions are loaded and executed on a computer, all or some of the procedure or functions according to the embodiments of this application are generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line) or wireless (for example, infrared, radio, or microwave) manner.

What is claimed is:

1. A single-phase converter control method, comprising:
obtaining an absolute value of a difference between a voltage corresponding to a first level output by a single-phase converter and a voltage corresponding to a second level output by the single-phase converter;
performing a calculation on the absolute value of the difference and a voltage reference value associated with the voltage corresponding to the first level and the voltage corresponding to the second level to obtain a common-mode modulated-wave change rate of the single-phase converter, wherein the absolute value of the difference is inversely proportional to the common-mode modulated-wave change rate, wherein the first level is a direct-current-side positive-bus level, and wherein the second level is a direct-current-side negative-bus level;
performing a calculation on a first-phase initial modulated wave of the single-phase converter, a second-phase initial modulated wave of the single-phase converter, and the common-mode modulated-wave change rate to obtain a common-mode modulated wave of the single-phase converter, wherein both the first-phase initial modulated wave and the second-phase initial modulated wave are sinusoidal waves, and wherein a sum of an amplitude of the first-phase initial modulated wave at any moment and an amplitude of the second-phase initial modulated wave at the same moment are zero;
performing a calculation on the first-phase initial modulated wave, the second-phase initial modulated wave, and the common-mode modulated wave to obtain a pulse width modulated wave of the single-phase converter; and
outputting a drive signal to the single-phase converter based on the pulse width modulated wave to control the single-phase converter to output different voltages.

2. The method of claim 1, wherein performing the calculation on the absolute value of the difference and the voltage reference value to obtain the common-mode modulated-wave change rate comprises:
dividing the absolute value of the difference by the voltage reference value to obtain a quotient; and
determining that the common-mode modulated-wave change rate is a first value when the quotient is less than or equal to a first preset threshold.

3. The method of claim 2, wherein after dividing the absolute value of the difference by the voltage reference value to obtain the quotient, the method further comprises determining that the common-mode modulated-wave change rate is a second value when the quotient is greater than the first preset threshold and less than or equal to a second preset threshold, and wherein the second value is less than the first value.

4. The method of claim 3, wherein after dividing the absolute value of the difference by the voltage reference value to obtain the quotient, the method further comprises determining that the common-mode modulated-wave change rate is a third value when the quotient is greater than the second preset threshold, and wherein the third value is less than the second value.

5. The method of claim 1, wherein performing the calculation on the absolute value of the difference and the voltage reference value to obtain the common-mode modulated-wave change rate comprises:
multiplying the absolute value of the difference by a preset adjustment coefficient to obtain a fourth value;
subtracting the fourth value from the voltage reference value to obtain a fifth value; and
dividing the fifth value by the voltage reference value to obtain the common-mode modulated-wave change rate.

6. The method of claim 1, wherein performing the calculation on the first-phase initial modulated wave of the single-phase converter, the second-phase initial modulated wave of the single-phase converter, and the common-mode modulated-wave change rate to obtain the common-mode modulated wave of the single-phase converter comprises:
performing a calculation on the second-phase initial modulated wave and the common-mode modulated-wave change rate to obtain a first modulated wave of the single-phase converter; and
comparing the first-phase initial modulated wave with the first modulated wave to obtain the common-mode modulated wave.

7. The method of claim 6, wherein performing the calculation on the second-phase initial modulated wave and the common-mode modulated-wave change rate to obtain the first modulated wave of the single-phase converter comprises:
subtracting the second-phase initial modulated wave from a modulated wave of a third level from the single-phase converter to obtain a second modulated wave of the single-phase converter; and
multiplying the second modulated wave by the common-mode modulated-wave change rate to obtain the first modulated wave, wherein the third level is zero level, and
wherein comparing the first-phase initial modulated wave with the first modulated wave to obtain the common-mode modulated wave comprises:
subtracting the first-phase initial modulated wave from a modulated wave of the first level to obtain a third modulated wave of the single-phase converter;
subtracting the first-phase initial modulated wave from a modulated wave of the second level to obtain a fourth modulated wave of the single-phase converter; and
comparing the first modulated wave, the third modulated wave, and the fourth modulated wave to determine the common-mode modulated wave, wherein an amplitude of the common-mode modulated wave at any moment is an amplitude with a minimum absolute value among an amplitude of the first modulated wave at the same moment, an amplitude of the third modulated wave at the same moment, and an amplitude of the fourth modulated wave at the same moment.

8. The method of claim 7, wherein an amplitude of the modulated wave of the first level at any moment, an amplitude of the modulated wave of the second level at any moment, an amplitude of the modulated wave of the third level at any moment, the amplitude of the first-phase initial modulated wave at any moment, or the amplitude of the second-phase initial modulated wave at any moment is greater than or equal to negative one and less than or equal to positive one.

9. The method of claim 1, wherein the pulse width modulated wave comprises a fifth modulated wave and a sixth modulated wave, and wherein performing the calculation on the first-phase initial modulated wave, the second-phase initial modulated wave, and the common-mode modulated wave to obtain the pulse width modulated wave of the single-phase converter comprising:
   adding the first-phase initial modulated wave and the common-mode modulated wave together to obtain the fifth modulated wave; and
   adding the second-phase initial modulated wave and the common-mode modulated wave together to obtain the sixth modulated wave.

10. A single-phase converter control apparatus, comprising:
   a common-mode modulated-wave change rate calculation circuit configured to:
      obtain an absolute value of a difference between a voltage corresponding to a first level output by a single-phase converter and a voltage corresponding to a second level output by the single-phase converter; and
      perform a calculation on the absolute value of the difference and a voltage reference value associated with the voltage corresponding to the first level and the voltage corresponding to the second level, to obtain the common-mode modulated-wave change rate of the single-phase converter, wherein the absolute value of the difference is inversely proportional to the common-mode modulated-wave change rate, wherein the first level is a direct-current-side positive-bus level, and wherein the second level is a direct-current-side negative-bus level;
   a common-mode modulated wave calculation circuit coupled to the common-mode modulated-wave change rate calculation circuit and configured to perform a calculation on a first-phase initial modulated wave of the single-phase converter, a second-phase initial modulated wave of the single-phase converter, and the common-mode modulated-wave change rate to obtain a common-mode modulated wave of the single-phase converter, wherein both the first-phase initial modulated wave and the second-phase initial modulated wave are sinusoidal waves, and wherein a sum of an amplitude of the first-phase initial modulated wave at any moment and an amplitude of the second-phase initial modulated wave at the same moment are zero;
   a pulse width modulated wave calculation circuit coupled to the common-mode modulated wave calculation circuit and configured to perform a calculation on the first-phase initial modulated wave, the second-phase initial modulated wave, and the common-mode modulated wave to obtain a pulse width modulated wave of the single-phase converter; and
   a carrier modulation circuit coupled to the pulse width modulated wave calculation circuit and configured to output a drive signal to the single-phase converter based on the pulse width modulated wave to control the single-phase converter to output different voltages.

11. The apparatus of claim 10, wherein the common-mode modulated-wave change rate calculation circuit is further configured to:
   divide the absolute value of the difference by the voltage reference value to obtain a quotient; and
   determine that the common-mode modulated-wave change rate is a first value when the quotient is less than or equal to a first preset threshold.

12. The apparatus of claim 11, wherein after dividing the absolute value of the difference by the voltage reference value to obtain the quotient, the common-mode modulated-wave change rate calculation circuit is further configured to determine that the common-mode modulated-wave change rate is a second value when the quotient is greater than the first preset threshold and less than or equal to a second preset threshold, and wherein the second value is less than the first value.

13. The apparatus of claim 12, wherein after dividing the absolute value of the difference by the voltage reference value to obtain the quotient, the common-mode modulated-wave change rate calculation circuit is further configured to determine that the common-mode modulated-wave change rate is a third value when the quotient is greater than the second preset threshold, and wherein the third value is less than the second value.

14. The apparatus of claim 10, wherein, to perform the calculation on the absolute value of the difference and the voltage reference value to obtain the common-mode modulated-wave change rate, the common-mode modulated-wave change rate calculation circuit is further configured to:
   multiply the absolute value of the difference by a preset adjustment coefficient to obtain a fourth value;
   subtract the fourth value from the voltage reference value to obtain a fifth value; and
   divide the fifth value by the voltage reference value to obtain the common-mode modulated-wave change rate.

15. The apparatus of claim 10, wherein the common-mode modulated wave calculation circuit is further configured to:
   perform a calculation on the second-phase initial modulated wave and the common-mode modulated-wave change rate to obtain a first modulated wave of the single-phase converter; and
   compare the first-phase initial modulated wave with the first modulated wave to obtain the common-mode modulated wave.

16. The apparatus of claim 15, wherein, to perform the calculation on the second-phase initial modulated wave and the common-mode modulated-wave change rate to obtain the first modulated wave of the single-phase converter, the common-mode modulated wave calculation circuit is further configured to:
   subtract the second-phase initial modulated wave from a modulated wave of a third level from the single-phase converter to obtain a second modulated wave of the single-phase converter; and
   multiply the second modulated wave by the common-mode modulated-wave change rate to obtain the first modulated wave, the third level being a zero level, and wherein when the common-mode modulated wave calculation circuit is configured to compare the first-phase initial modulated wave with the first modulated wave to obtain the common-mode modulated wave, the common-mode modulated wave calculation circuit is further configured to:
subtract the first-phase initial modulated wave from a modulated wave of the first level to obtain a third modulated wave of the single-phase converter;
subtract the first-phase initial modulated wave from a modulated wave of the second level to obtain a fourth modulated wave of the single-phase converter; and
compare the first modulated wave, the third modulated wave, and the fourth modulated wave to determine the common-mode modulated wave, wherein an amplitude of the common-mode modulated wave at any moment is an amplitude with a minimum absolute value among an amplitude of the first modulated wave at the same moment, an amplitude of the third modulated wave at the same moment, and an amplitude of the fourth modulated wave at the same moment.

17. The apparatus of claim 16, wherein amplitude of the modulated wave of the first level at any moment, amplitude of the modulated wave of the second level at any moment, amplitude of the modulated wave of the third level at any moment, the amplitude of the first-phase initial modulated wave at any moment, or the amplitude of the second-phase initial modulated wave at any moment is greater than or equal to negative one and less than or equal to positive one.

18. The apparatus of claim 10, wherein the pulse width modulated wave comprises a fifth modulated wave and a sixth modulated wave, and wherein the pulse width modulated wave calculation circuit iS further configured to:
add the first-phase initial modulated wave and the common-mode modulated wave together to obtain the fifth modulated wave; and
add the second-phase initial modulated wave and the common-mode modulated wave together to obtain the sixth modulated wave.

* * * * *